United States Patent
Hubert et al.

(10) Patent No.: US 9,472,271 B2
(45) Date of Patent: Oct. 18, 2016

(54) METHOD OF PROGRAMMING A PHASE CHANGE MEMORY AND PHASE CHANGE MEMORY DEVICE

(71) Applicants: COMMISSARIAT A L'ENERGIE ATOMIQUE ET AUX ENE ALT, Paris (FR); Institut Polytechnique de Grenoble, Grenoble (FR)

(72) Inventors: Quentin Hubert, Grenoble (FR); Carine Jahan, Grenoble (FR)

(73) Assignees: COMMISSARIAT A L'ENERGIE ATOMIQUE ET AUX ENERGIES ALTERNATIVES, Paris (FR); Institut Polytechnique de Grenoble, Grenoble (FR)

( * ) Notice: Subject to any disclaimer, the term of this patent is extended or adjusted under 35 U.S.C. 154(b) by 52 days.

(21) Appl. No.: 14/175,271

(22) Filed: Feb. 7, 2014

(65) Prior Publication Data

US 2014/0233307 A1    Aug. 21, 2014

(30) Foreign Application Priority Data

Feb. 8, 2013 (FR) ...................................... 13 51094

(51) Int. Cl.
*G11C 13/00* (2006.01)
*G11C 17/16* (2006.01)

(52) U.S. Cl.
CPC ......... *G11C 13/0004* (2013.01); *G11C 13/004* (2013.01); *G11C 13/0069* (2013.01); *G11C 17/165* (2013.01); *G11C 2013/0083* (2013.01)

(58) Field of Classification Search
CPC ............ G11C 13/0004; G11C 13/004; G11C 13/0069; G11C 17/165; G11C 2013/0083
USPC .................................................. 365/163, 148
See application file for complete search history.

(56) References Cited

U.S. PATENT DOCUMENTS

| | | | | |
|---|---|---|---|---|
| 7,575,950 B2* | 8/2009 | Shiba | ..................... | H01L 23/585 257/E31.029 |
| 8,569,728 B2* | 10/2013 | Takano | ............... | G11C 11/5685 257/2 |
| 8,686,386 B2* | 4/2014 | Tendulkar | ........... | H01L 45/1608 257/2 |

(Continued)

FOREIGN PATENT DOCUMENTS

| | | |
|---|---|---|
| EP | 2 402 953 A1 | 1/2012 |
| WO | WO 2006/078505 A2 | 7/2006 |
| WO | WO 2007/141865 A1 | 12/2007 |

OTHER PUBLICATIONS

French Preliminary Search report issued Oct. 9, 2013 in French Application 13 51094, filed on Feb. 8, 2013 ( with English translation of Categories of Cited documents and written opinion).

(Continued)

*Primary Examiner* — Vu Le
*Assistant Examiner* — Sung Cho
(74) *Attorney, Agent, or Firm* — Oblon, McClelland, Maier & Neustadt, L.L.P.

(57) ABSTRACT

A method for pre-programming a matrix of phase-change memory cells, including a phase-change material positioned between two conducting electrodes and able to be reversely electrically modified so as to vary the resistivity of the memory cell. A dielectric layer is provided with the memory cell having an original resistive state at the end of the memory cell production process. A pre-programming of the matrix is executed prior to mounting a component containing the matrix on a support. A breakdown voltage is applied to a selection of memory cells so that, for each one of the selected cells, the layer of the dielectric material breaks down to bring the cell from the original resistive state to a second resistive state.

14 Claims, 6 Drawing Sheets

(56) References Cited

U.S. PATENT DOCUMENTS

| | | | | |
|---|---|---|---|---|
| 2005/0158950 A1* | 7/2005 | Scheuerlein | G11C 5/02 | 438/257 |
| 2006/0250836 A1* | 11/2006 | Herner | G11C 11/5685 | 365/148 |
| 2009/0168492 A1* | 7/2009 | Thorp | G11C 13/0004 | 365/148 |
| 2009/0237985 A1* | 9/2009 | Matsuzaki | G11C 11/005 | 365/163 |
| 2009/0302293 A1* | 12/2009 | Morikawa | H01L 45/06 | 257/2 |
| 2011/0084240 A1* | 4/2011 | Schell | H01L 45/06 | 252/572 |
| 2011/0317480 A1* | 12/2011 | Lung | G11C 13/0004 | 365/163 |
| 2012/0081946 A1* | 4/2012 | Kawabata | G11C 11/5685 | 365/148 |
| 2013/0322162 A1* | 12/2013 | Lee | G11C 11/1653 | 365/158 |
| 2014/0078809 A1* | 3/2014 | Katoh | H03K 3/0375 | 365/148 |

OTHER PUBLICATIONS

French Preliminary Search report issued Oct. 15, 2013 in French Application 13 51093, filed on Feb. 8, 2013 ( with English translation of Categories of Cited documents and written opinion).

French Preliminary Search report issued Oct. 16, 2013 in French Application 13 51095, filed on Feb. 8, 2013 ( with English translation of Categories of Cited documents and written opinion).

* cited by examiner

Prior Art

METHOD OF PROGRAMMING A PHASE CHANGE MEMORY AND PHASE CHANGE MEMORY DEVICE

TECHNICAL FIELD OF THE INVENTION

The present invention relates, in general, to resistive non-volatile memories, and more particularly to resistive memories which may be used within the scope of an industrial process for manufacturing embedded systems wherein such memories can advantageously be pre-programmed in their production environment without the stored data being lost afterwards because of the heat constraints, and more particularly mounting constraints, which they are exposed to during the steps of welding or reflow soldering of the components.

STATE OF THE ART

In addition to electronic, optical or mechanical elements belonging to each system, computer embedded systems always use microprocessors or micro-controllers and electronic memories required for ensuring the operation thereof. Typically, all the components which compose an embedded system are mounted on one or more printed circuit(s) or electronic card(s), which are often also called PCB, i.e. "printed circuit board(s)". Mounting is generally automatized, in a production line. The electronic components are most often in the form of components intended to be surface-mounted (without any through-type insert). Then they are simply positioned on the printed circuit by a positioning machine. Welding or brazing paste shall have been deposited beforehand onto the terminals of the components and/or of the printed circuit. The printed circuit whereon the components are positioned is then placed in a heating furnace, typically a so-called tunnel furnace, wherein the temperature gradient is so adjusted as to melt the deposited paste, which provides, when cooled, a mechanical fixing of the components and an excellent electrical contact. This standard manufacturing operation of a printed circuit is called reflow brazing or soldering, in the technical literature.

At least a part of the memories composing an embedded system is nearly always of the non volatile type. For example, to be able to permanently store therein the operational code, also called the microcode, of the micro-processor(s) or micro-controller(s) which is/are used for providing the function which the embedded system has been designed for. Usual practice consists in the manufacturing process requesting that the non volatile part of the memories can be programmed prior to mounting onto the printed circuit. A very significant advantage of this procedure is that a specific code intended to test the printed circuit as soon as it is mounted, in order to check the integrity thereof, can for instance be pre-programmed in the non volatile part. Another exemplary advantage related to the possibility of pre-programming the non volatile memories relates to secure chip cards, also called "secure smart cards". The issuers of such cards, such as banks, prefer the confidential data they contain to be introduced prior to mounting, so that they don't have to check the distribution of such sensitive information beyond the manufacturing line.

If the operation code or the functional data the non volatile memory must contain have not been pre-programmed, they must be loaded in situ, i.e. into the non volatile memory after assembling thereof, and after the connexion thereof with the other components on the printed circuit. Means have long been developed by the microelectronics industry to provide this function after mounting. A usual practice consists in using the tests circuits which are contained in nearly all the circuits developed by this industry, more particularly the so-called JTAG ("Joint Test Action Group") circuits, which refers to a workgroup which enabled to define a strategy and means for testing printed circuits as from the mid eighties, in order to check the correct operation of ever more complex circuits. As a standard, the JTAG circuits make it possible to individually access the components mounted on a printed circuit through a specialized series interface which can also enable an in-situ programming of the non volatile part of the memory. The intrinsically small access time and the limited available bandwidth of this method result in the code loading being a very long operation which may slow down the manufacturing line.

Other means have been provided for the in-situ programming of the non volatile part of the memories which have their own disadvantages such as requiring specialised connection points which will have no functional utility and/or an interface dedicated to such function in order to enable, on the one hand, the writing of a code into the non volatile part of the memory, and, on the other hand, the controlling of the other components so that these can be inhibited, so as not to interfere with the code loading. This, of course, significantly complicates the design of the embedded system and also generally requires the development of a specialized programming tool for loading the code after mounting in the manufacturing line.

Whenever possible, the whole code, i.e. not only the test code, but also the functional code, is preferably loaded prior to mounting. This avoids an in-situ programming with all the drawbacks briefly mentioned above.

The presently used non volatile memories are mainly so-called Flash memories, wherein each memory point is a Metal Oxide semiconductor (MOS) having a floating grid wherein carriers are trapped. Programming such memories is executed by applying to the electrodes higher voltages than those used for reading same. Such voltages make it possible to bring charges into the floating grid, or to evacuate them therefrom, in order to permanently modify, when reading, the conduction threshold of the transistor, so as to be able to store at least two different electric levels, i.e. an information bit therein. Carriers are trapped and evacuated through the very thin oxide layer forming the grid of the MOS transistor by implementing quantal effects of the tunnelling effect or hot electron types. This type of non volatile storage is not particularly affected by temperature. Flash memories are not at all affected by the programming prior to mounting. Their contents is not affected by the reflow soldering operation described above, wherein the maximum temperature reached is typically about 245° C. for the soldering pastes containing lead. Using unleaded pastes, as required now for their not polluting property, increases temperature up to 260° C., even higher, which still has no negative effect on the retention of the data pre-programmed in this type of memory. The main disadvantage of the Flash memories is that the programming thereof requires, as mentioned above, applying significant voltages to transfer charges into or from the floating grid. Writing therein is a relatively slow and complicated operation which may have to be carried out, depending on the internal structure thereof, of the so-called AND or OR types, on cell blocks which have to be erased prior to re-writing new data.

This is the reason why the designers of embedded systems now prefer using other types of non volatile memories which have none of these drawbacks. This more particularly concerns so-called "resistive" memories, which are globally called RRAM ("Resistive Random Access Memory") memories, wherein storage is obtained by reversibly electrically modifying the material composing each cell so that it can take at least two different resistance values, in order to store an information bit therein.

Among the resistive memories, we can mention those using a phase-change material the atomic structure of which can reversibly vary under the effect of heat. Such memories, referred to by the acronym PCM for "phase-change memory", are preferred for developing new products provided with Flash memories since they are intrinsically denser and writing is simpler and quicker than for Flash memories. The phase-change material typically used is a chalcogenide and in particular an alloy comprising one or more of the following elements: germanium (Ge), antimony (Sb), tellurium (Te), indium (In), gallium (Ga). Besides, this alloy may be doped using one or more of the above elements as well as elements such as carbon, nitrogen, oxygen, silicon, hafnium and components thereof. The most common phase-change material is the alloy of germanium, antimony and tellurium as $Ge_2Sb_2Te_5$, known by the acronym GST.

A phase-change memory is for instance described in document EP2402953.

The PCM memories have been designed to operate at temperatures which may reach 85° C. for 10 years and thanks to their operation principle shortly disclosed above, they are intrinsically sensitive to the temperature of the environment they must operate in. As the retention time thereof rapidly decreases according to the temperature they are exposed to, the resistive memories of the PCM type cannot be usefully pre-programmed prior to mounting since the stored information is then lost during the reflow soldering operation, during which temperatures which may reach 260° C. may be applied.

Thus the object of the invention is to provide a solution enabling the devices integrating a matrix of phase-change memory cells not to lose, during mounting, the pre-programming of the matrix.

Other purposes, characteristics and advantages of this invention will become apparent upon examination of the following description and appended drawings. It is understood that other advantages can be included.

SUMMARY OF THE INVENTION

According to one embodiment, the invention more particularly relates to a method for pre-programming a matrix of phase-change resistive non volatile memory cells, with said memory cells each comprising a phase-change material positioned between two conducting electrodes and able to be reversely electrically modified so as to vary the resistivity thereof, and thus to vary the resistance of the memory cell, for each memory cell, at least a dielectric layer is provided, which is positioned between the two conducting electrodes, with the memory cell having an original resistive state (original HRS) at the end of the memory cell production process, and prior to any step of programming the cells.

A step of pre-programming the matrix is executed prior to a step of mounting a component containing said matrix onto a support. The step of pre-programming comprising applying a breakdown voltage to a selection of memory cells so that, for each one of the selected cells, the layer of the dielectric material breaks down to bring the cell from the original resistive state (original HRS) to a second resistive state (breakdown LRS), so that the cells which were, prior to mounting, in said original resistive state (original HRS) are, after the step of mounting, in a third resistive state (mounting HRS) so that the cells which were, prior to mounting, in said second resistive state (breakdown LRS) are, after the step of mounting, in a fourth resistive state (mounting LRS), and so that the resistance of the cells in the third resistive state (mounting HRS) is at least twice higher than the resistance of the cells in said fourth resistive state (mounting LRS).

Preferably, at least the following step is executed after mounting a component containing said matrix on a support: reading the resistive state of all the cells in the matrix so as to identify the cells which are, after mounting, in said third resistive state (mounting HRS) and those which are in said fourth resistive state (mounting LRS). This step thus consists in reading the resistive state of each cell (mounting HRS or mounting LRS). It is then possible to deduce therefrom the cells which were, prior to mounting, in said original resistive state (original HRS) and those which were, prior to mounting, in said second resistive state (breakdown LRS).

The switching from the original resistive state (original HRS) to the third resistive state (mounting HRS) is caused by the step of mounting, only. Similarly, the switching from the second resistive state (breakdown LRS) to the fourth resistive state (mounting LRS) is caused by the step of mounting, only.

Preferably and optionally, at least the following steps are executed after mounting a component containing said matrix onto a support:

storing the resistive states (mounting HRS, mounting LRS) read in an auxiliary memory so as to save the pre-programming of the matrix, applying a breakdown voltage to at least a plurality of memory cells so that all the layers of dielectric material of all or part of the memory cells break down, in order to bring all the cells in the matrix to said fourth resistive state (breakdown LRS), rewriting, into the matrix, the pre-programming saved in the auxiliary memory by modifying the phase-change material of selected memory cells.

The resistance of the memory cell is thus modified by altering the dielectric layer, prior to mounting a component containing said matrix onto a support and thus prior to applying a significant thermal stress, for instance, by welding or brazing.

The original resistive state (original HRS) revealed stable even when exposed to a high temperature. The resistance of the cell in the original HRS state is thus equal or substantially equal to the resistance of the cell in the mounting HRS state, i.e. the resistance of the cells which are not broken down is not or is slightly modified by the increase of heat caused by the step of mounting. Besides, the resistivity of the cell switched to the second resistive state (breakdown LRS) varies slightly enough when the cell is exposed to a high temperature for this state to remain easily differentiable from the original resistive state. Thus, even when the matrix of cells is exposed to a high thermal stress when mounted onto a support, typically when it is welded or brazed on a board, it keeps its pre-programming.

Such pre-programming is thus preferably saved in an auxiliary memory. The dielectric layers of all or part of the cells in the matrix then breakdown. If all the memory cells need not be used subsequently, it may be advantageous to leave a part of the cells in the matrix in the mounting HRS state (more particularly to save power and time). The memory cells, the dielectric layer of which is broken down may then go back to a usual operation as conventional phase-change memory cells. For instance, the phase of the phase-change material of the same cell can be reversibly modified to write and erase said memory cell.

The matrix is then re-programmed by modifying the phase of the phase-change material of selected cells, on the basis of the programming saved in the auxiliary memory. When some data must neither be erased nor written, it may be advantageous to store such data in cells of the matrix in the mounting HRS state and in the mounting LRS state since both states are highly resistant to temperature.

After mounting, the memory cell may be in two resistive states prior to mounting: a resistive state wherein the layer of dielectric material has not broken down prior to mounting and another resistive state wherein the layer of the dielectric material has broken down prior to mounting.

The invention then provides for a simple and reliable solution to keep the programming of a matrix of phase-change memory cells after a step of mounting during which a high thermal stress is applied to the matrix.

Besides, such solution is very easily integrated. It is compatible with a wafer-level type solution, i.e. a solution wherein the pre-programming is executed at the wafer level and prior to cutting chips in the wafer.

The invention also provides for a very wide utilisation by offering the possibility of using layers of phase-change material manufactured in various materials and by simply adding the layer of dielectric material to the memory cell.

According to another embodiment, the invention more particularly relates to a method for pre-programming a matrix of resistive non volatile memory cells, comprising a phase-change material positioned between two conducting electrodes and able to be reversely electrically modified so as to vary the resistivity of the memory cell. It is provided that, for each memory cell, a layer of dielectric material is positioned between the two conducting electrodes, with the memory cell having an original resistive state (original HRS) at the end of the memory cell production process, and prior to any step of programming the cells. A step of pre-programming is executed, which comprises, prior to mounting said matrix onto a support: applying a breakdown voltage to a selection of memory cells so that, for each one of the selected cells, the layer of the dielectric material breaks down to bring the cell from the original resistive state (original HRS) to a second resistive state (breakdown LRS), wherein the resistance of the cells is at least twice lower and preferably five times lower, and even more preferably ten times lower than the resistance of the cells in the original resistive state (original HRS).

According to another embodiment, the invention relates to a phase-change memory cell comprising a phase-change material and at least one electrode, characterized in that it comprises a dielectric layer positioned between the layer of phase-change material and the electrode, so that the memory cell initially is in an original resistive state (original HRS), with the memory cell being so configured as to enable selectively breaking down the dielectric layer so that the resistance of the memory cell is, after breakdown, in a second resistive state (breakdown LRS), the resistance of which is at least twice lower than the resistance of the memory cell in the original resistive state (original HRS).

Preferably, the resistance of the cell in the original resistive state (original HRS) is at least five times higher, and more preferably at least ten times higher than the resistance of the cell in said second resistive state (breakdown LRS).

According to one embodiment, the dielectric layer is in contact with at least one among the layer of phase-change material and a heating element. The contact surface between the dielectric layer and at least one among the layer of phase-change material and a heating element is smaller than the surface of the face of the dielectric layer with respect to at least one among the layer of phase-change material and a heating element.

According to another embodiment, the invention relates to a phase-change memory cell comprising a phase-change material and at least one electrode, characterized in that it comprises a dielectric layer positioned between the layer of phase-change material and the electrode, so that the memory cell initially is in an original resistive state (original HRS), with the memory cell being so configured as to enable selectively breaking down the dielectric layer so that the resistance of the memory cell is, after breakdown, in a second resistive state (breakdown LRS), so that the cells which were prior to mounting, in said original resistive state (original HRS) are, after the step of mounting, in a third resistive state (mounting HRS), so that the cells which were, prior to mounting, in said second resistive state (breakdown LRS) are, after the step of mounting, in a fourth resistive state (mounting LRS), and in that the resistance of the cells in said third resistive state (mounting HRS) is at least twice higher than the resistance of the cells in said fourth resistive state (mounting LRS).

According to one embodiment, the memory cell is so configured that the current flowing between the two conducting electrodes flows through the dielectric layer, with the dielectric layer being in contact with at least one among the layer of phase-change material and a heating element The contact surface between the dielectric layer and at least one among the layer of phase-change material and a heating element is smaller than the surface of the face of the dielectric layer with respect to at least one among the layer of phase-change material and a heating element.

According to one embodiment, the layer of phase-change material has a tubular portion. The contact surface between the phase-change material and the dielectric material is a ring, which makes it possible to reduce such surface with respect to a solution wherein such surface is a disk.

According to one embodiment, the layer of phase-change material is formed as a cylinder, the diameter of which is smaller than the surface of the face of the dielectric material in contact with the cylinder.

According to one embodiment, the layer of phase-change material is positioned in contact with the layer of phase-change material and a conducting element. According to one embodiment, the conducting element has a tubular portion and wherein the contact surface between the conducting element and the dielectric material is a ring.

According to one embodiment, the layer of phase-change material is positioned in contact with a first conducting element and a second conducting element and is inserted between the first conducting element and the second conducting element.

According to an advantageous embodiment, the resistance of the memory cell is so configured as to vary according to the phase of the phase-change material. The memory cell is thus so configured as to return to a standard operation of the phase-change memory cell after breakdown of the dielectric layer.

According to an advantageous an optional embodiment, the resistance in the original resistive state is greater than or equal to $1^{e}7$ ohms. Such value depends, for instance, on the material used, the thickness thereof, the contact area, the manufacturing method, the phase (amorphous, crystalline) thereof.

According to an advantageous and optional embodiment, the resistance after breakdown of the dielectric layer is less than or equal to $1^e6$ ohms.

The dielectric layer is made of only one layer of material. In an alternative solution, it is composed of a stack of several dielectric layers. The alternative solution comprising several layers has numerous advantages. For instance, one or some of the dielectric layers may play a mechanical part, for instance, for improving the adherence or the compliance or the roughness. Such layer may, for instance, be made of alumina (Al2O3). One or more layer(s) may compose the dielectric to be effectively broken down. Besides, each layer could play an electrical part. For instance, a layer could be used as a current limiter during the breakdown of another layer, which could enable a better control of the breakdown.

In the present invention, micro-electronic device means any type of device produced with micro-electronic means. Such devices more particularly concern, in addition to purely electronic purposes devices, micro-mechanical or electro-mechanical devices (MEMS, NEMS . . . ) and optical or opto-electronic devices (MEOMS . . . ).

The object of the present invention is also a micro-electronic device comprising a matrix of pre-programmed memory cells implementing a method according to the invention.

The object of the present invention is also a micro-electronic device comprising a matrix of non volatile memory cells according to the invention.

Another object of the present invention is a micro-electronic device comprising a matrix of non volatile memory cells according to the preceding claim, wherein the matrix is contained in a component mounted on a support, characterized in that some of the cells in the matrix are in the original resistive state (original HRS) or in the third resistive state (programmed HRS) and in that the other cells are in a resistive state different from the original resistive state (original HRS) or from the third resistive state (programmed HRS).

Preferably, but not restrictively, the micro-electronic device is so configured as to save in the auxiliary memory the information stored in the matrix and to rewrite, after breakdown of the dielectric layers of all or part of the cells in the matrix, rewrite the memory cells according to the information saved in the auxiliary memory.

BRIEF DESCRIPTION OF THE FIGURES

The goals and objectives as well as the characteristics and advantages of the invention will emerge better from the detailed description of an embodiment of this latter, illustrated by the following accompanying drawings in which.

Figure 1A:
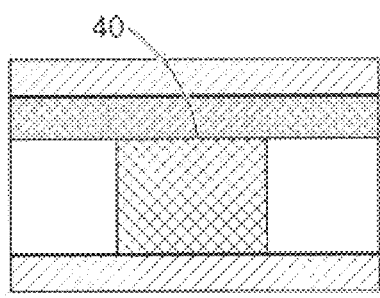
FIGS. 1a to 1d illustrate structures of memory cell of the PCM type typical of the prior art.

The drawings appended herein are given as examples and are not limiting to the invention.

DETAILED DESCRIPTION OF THE INVENTION

It should be noted that, within the scope of the present invention, the words "on", "lies above" or "under" or the equivalent thereof do not necessarily mean "in contact with". Thus, for instance, depositing a first layer on a second layer does not necessarily mean that both layers are directly in contact with each other, but this means that the first layer at least partially covers the second layer by being either directly in contact therewith or by being separated therefrom by another layer or another element.

Within the scope of the present invention, pre-programming means programming some memory cells, which is carried out prior to mounting the matrix onto a support, typically during an operation using a temperature higher than or equal to 200° C.

Advantageous embodiments are now disclosed prior to disclosing a detailed description of an exemplary embodiment of the invention. These embodiments may be taken separately or in combination.

According to one embodiment, the current flowing through the two conducting electrodes goes through the dielectric material. Preferably, the whole current flowing from one conducting electrode to the other one necessarily goes through the dielectric material.

The step of pre-programming comprises applying a breakdown voltage to a selection of memory cells so that, for each one of the selected cells, the layer of dielectric material breaks down to bring the cell from the original resistive state (original HRS) to a second resistive state (breakdown LRS) so that the resistance (mounting LRS), as measured after the step of mounting, of each cell which was, prior to mounting, in said second resistive state (breakdown LRS) is at least five times and even more preferably ten times higher than the resistance (mounting HRS) measured after the step of mounting, of each cell which was, prior to mounting in said original resistive state (original HRS).

Upon completion of the step of pre-programming, the cells which do not belong to the selection of cells are advantageously left in the original resistive state.

Typically, the step of mounting comprises a step of brazing or welding the component onto the support.

In an alternative solution, the step of mounting comprises a method of the WLCSP type (the acronym for Wafer Level Chip Scale Packages), which is translated in French by "procédé dé réalisation d'un boitier à la taille d'une puce au niveau du substrat".

According to a preferred embodiment, the step of mounting comprises a step during which the memory cells are exposed to a temperature of at least 240° C. for at least 10 seconds. Preferably, the step of mounting comprises the application of a temperature higher than or equal to 260 degrees Celsius for at least 10 seconds.

Preferably, the step of mounting, typically WLCSP, comprises a step during which the memory cells are exposed to a temperature above 300° C. for several minutes. Preferably, the step of mounting comprises the application of a temperature higher than or equal to 300° C. for at least 30 seconds. Preferably the step of mounting comprises applying a temperature ranging from 320° C. to 375° C. for a duration from 40 to 80 minutes.

Preferably, the step of mounting the component containing said matrix on the support comprises mounting the component onto a printed card, an electronic card, or with another electronic component or on a box. Typically, the step of mounting consists in welding or brazing a component comprising the matrix of memory cells onto a mother board.

According to an advantageous embodiment, during the step of applying a breakdown voltage to at least a plurality of memory cells so that all the layers of the dielectric material of all the memory cells in the matrix break down, the breakdown voltage is applied to the cells in the mounting HRS state. Advantageously, this makes it possible to apply the breakdown voltage to the cells which require it only, with the other cells being already in the mounting LRS state upon completion of the pre-programming state. The method velocity is thus increased and the power consumption is reduced. Besides, the step of previous reading makes it possible to identify the cells the layer of dielectric material of which has already broken down and those for which this has not happened yet.

Preferably, applying a breakdown voltage to a selection of memory cells comprises, for each of the selected cells, applying a voltage ramp, preferably ranging from a null or minimum voltage and 10 volts and preferably between a null or minimum voltage and 5 volts for preferably less than 500 milliseconds, and preferably less than 100 milliseconds.

In an alternative solution, applying a breakdown voltage to a selection of memory cells comprises, for each selected cell, applying a succession of voltage pulses. Preferably, the amplitude of pulses is increasing. Preferably, the duration of the pulses is less than 1 millisecond and preferably less than 500 microseconds.

In an alternative solution, applying a breakdown voltage to selected memory cells comprises, for each one of the selected cells, applying a constant voltage.

The invention applies to all the memory cells for which the distribution of the resistances in the mounting HRS state does not overlap the distribution of the resistances in the mounting LRS state. A discrepancy between the resistances must then exist between the distributions. Preferably, such discrepancy in the resistance is at least a factor 10.

Advantageously, the resistances of the memory cells in the matrix in the original resistive cell (original HRS) are included in a first range of values, the resistances of the memory cells in the second resistive state (breakdown LRS) are included in a second range of values and the first and second ranges are separated prior to the step of mounting.

Advantageously, the resistances of the memory cells in the matrix in said third resistive cell (mounting HRS) are included in a first range of values, the resistances of the memory cells in the matrix in the fourth resistive state (mounting LRS) are included in a second range of values and the first and second ranges are separated prior to the step of mounting.

Preferably the first and second ranges show a discrepancy of at least an order of magnitude, (×10) and preferably two orders of magnitude (×100). Preferably, the resistance of the memory cell in the original resistive state is at least ten times higher, and preferably one hundred times higher than the resistance of the memory cell in the second resistive state. Such interval is checked after the step of mounting, i.e. after applying a high temperature.

According to a preferred embodiment, reading the resistive state of all the memory cells in the matrix comprises: applying a reading voltage ranging from 50 mV to 0.7V to each memory cell; measuring the intensity of the current flowing through the memory cell so as to deduce therefrom whether the resistance of this memory cell is in the original resistive state (original HRS) or in the second resistive state (breakdown LRS).

According to a preferred embodiment, the dielectric layer is in contact with the layer of phase-change material and optionally an electrode.

According to one embodiment, the layer of phase-change material has a tubular portion and the contact surface between the layer of phase-change material and the dielectric material is a ring. Preferably, the bottom of the tube at the end thereof which is opposed to the end of the tube in contact with the layer of dielectric material is solid. In an alternative solution, the layer of phase-change material is formed as a solid cylinder, such as a column, the diameter of which is smaller than the surface of the face of the dielectric material in contact with the cylinder.

According to a preferred embodiment, the layer of phase-change material is positioned in contact with the layer of phase-change material and a conducting element. According to one embodiment, the conducting element has a tubular portion and wherein the contact surface between the conducting element and the dielectric material is a ring.

According to one preferred embodiment, the layer of phase-change material is positioned in contact with a first conducting element and a second conducting element and is inserted between the first conducting element and the second conducting element.

According to a preferred embodiment, the cell comprises at least two layers of phase-change material and the dielectric layer is inserted between the two layers of phase-change material.

According to a preferred embodiment, the cell comprises a plurality of layers forming the dielectric layer.

According to one embodiment, the conducting element is so configured as to lead current and voltage to the layer of dielectric material. Under the effect of the additional current and voltage, the layer of dielectric material breaks down, which modifies the resistive state of the cell. Such conducting element preferably confines the area whereto current and voltage are applied. Preferably, it has an outer diameter smaller than that of the dielectric layer. It thus forms an element confining the area activated by the application of current and voltage.

According to one embodiment, the conducting element is so configured to heat when current flows therethrough. The heat produced may then be transmitted to the phase-change material to change the phase of the latter.

According to one embodiment, the conducting element is so configured as to lead current to the phase-change material. Under the effect of the addition of current, the phase-change material heats and changes phase, which modifies the resistive state of the cell.

Preferably, the application of a current flowing through the electrodes and the phase-change material makes it possible to modify the phase of the phase-change material, and thus to modify the resistance of the memory cell when the latter operates as a conventional phase-change memory.

According to a preferred embodiment, the layer of dielectric material has a resistance higher than or equal to à $1^e7$ ohms and preferably higher than or equal to $1^e6$ ohms prior to applying the breakdown voltage.

Preferably, the layer of dielectric material has a resistance lower than or equal to à $1^e6$ ohms and preferably lower than or equal to $1^e4$ ohms after applying the breakdown voltage.

Advantageously, the layer of dielectric material is so selected as to be made conducting by applying a voltage ramp or a succession of voltage pulses or a continuous voltage at ambient temperature. Preferably, the maximum voltage applied during the voltage ramp or the succession of voltage pulses or during the continuous voltage is preferably lower than the maximum voltage which can be provided by the aimed application, i.e. typically 5V for the mobile applications.

According to one preferred embodiment, the layer of dielectric material has a thickness of less than 25 nm and preferably ranging from 2 nm to 10 nm. More generally the material used, the thickness thereof, the area of the conducting element in contact with the dielectric material, the structure of the cell, are so selected that in the original state, the dielectric material does not leak much (thus a high original HRS resistance) but can breakdown with a relatively low voltage (<5V) so that breakdown does not damage/destroy the memory cell, breakdown is stable over time and the obtained LRS state has a resistance sufficiently different from that of the HRS state.

Advantageously, the layer of dielectric material is made of a material having a high resistance in the original state, and may be broken down. Non restrictive examples of such materials are oxides, oxinitrides, based on silicon, hafnium, zirconium, titanium, nitrogen, oxygen or the compounds thereof. Examples of such materials are hafnium oxide (HfO2), titanium oxide (TiO2), zirconium oxide (ZrO2), silicon oxide (SiO2).

Advantageously, the phase-change material typically used is a chalcogenide and in particular an alloy comprising one or more of the following elements: germanium (Ge), antimony (Sb), tellurium (Te), indium (In), gallium (Ga). Besides, this alloy may be doped using one or more of the above elements as well as elements such as carbon, nitrogen, oxygen, silicon, hafnium and components thereof. A phase-change material which may be used is the alloy of germanium, antimony and tellurium as $Ge_2Sb_2Te_5$, known by the acronym GST.

FIGS. 1a to 1d illustrate structures of memory cell of the PCM type typical of the prior art. It should be noted here that many structures of such memory cells exist. FIG. 1a told are only examples of resistive memory cells which the invention may apply to. Such examples are not at all restrictive, and all the known structures of PCM memory cells are liable to take advantage of the invention.

Generally, whatever the structure, the phase-change material is always positioned between two conducting elements which may be of various shapes and made of various materials, including, in particular, the materials currently used in micro-electronics for interconnections, i;e. aluminium (Al), copper (Cu), silicon (Si), tantalum (Ta), titanium (Ti), nitrogen (N), carbon (C) as well as the alloys obtained from these materials. Such conducting elements intended for the interconnections between the memory cells or between these and the other components of an electronic device comprise a first electrode or upper electrode 10 and a second electrode or lower electrode 60.

Figure 1B:
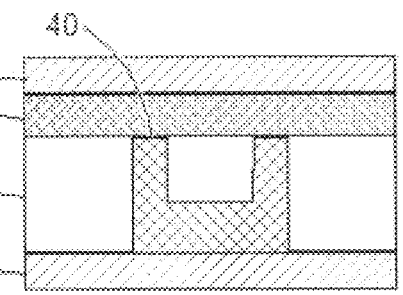
Figure 1C:
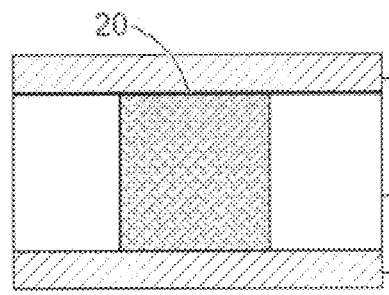
Figure 1D:
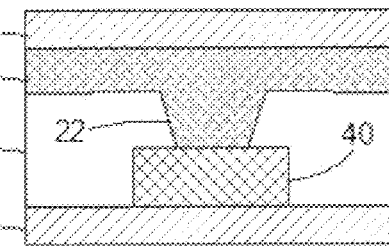

Depending on the structures, the phase-change material is in the form of a layer 20 which may have a constant thickness like the structures of FIGS. 1a, 1b and 1c or fill cavities or trenches 22 which have been provided in the thickness of the cell like in the example in FIG. 1d. The layer of phase-change material may cover the whole of the cell surface such as in FIGS. 1a and 1b or only a part thereof as shown in the example in FIG. 1c.

Optionally, a third conducting element 40 exists, which is then generally used as a means for heating the phase-change layer 20 in order to make it locally transit between such different phases: crystalline, not crystalline and/or amorphous. Such conducting element is then made of a heat-resistant conducting element. It is typically made of tungsten (W).

The heating means may be in various forms. It may have the shape of a solid column, having a typical circular cross-section, as in FIG. 1a or the shape of a partially hollow ring, as in FIG. 1b.

The cell of FIG. 1c is an exemplary so-called confined structure which includes no third conducting element and wherein the layer of phase-change material is self-heating.

Eventually, whatever the structure, it is most often completed with a dielectric material 50 which is more particularly used for insulating the third conducting element and/or the phase-change material if the latter does not cover the whole of the cell surface, like the example in FIG. 1c. Depending on the embodiments, such material is typically silicon oxide (SiO2) or silicon nitride (SiN).

FIGS. 2a to 2f illustrate structures of memory cell of the PCM type according to the invention comprising a thin additional dielectric layer 30.

It should be noted that, functionally, whatever the structure, the dielectric layer 30 is so positioned that, in the memory cell, it is in series with the conducting electrodes 10 and 60, with the layer of phase-change material 20 as well as with the third conducting element 40 if any. FIGS. 2a to 2f only illustrate particular exemplary positioning of a dielectric layer according to the invention. As shown in the example of FIG. 2e, it should be noted that the layer needs not be in direct contact with the phase-change material. The only constraint is that the dielectric layer must be connected in series with the electrodes and the phase-change material and must initially prevent the flow of current. Thus, the current flowing from one electrode to the other electrode must necessarily go through this dielectric material 30.

For this purpose, the dielectric layer 30 is initially high resistive. The initial electric resistance of a memory cell is typically above $10^7$ ohms and preferably above $10^{10}$ ohms. In the present application for a patent, this state is also called the original resistive state or "high" state. It is also designated by the acronym original HRS (for original high resistive state).

This resistive state of the memory cell is obtained at the end of the production of the memory cell and prior to the application of a voltage to the memory cell aiming at modifying the resistance thereof.

Such original or "high" state is obtained after forming the dielectric layer and the electrodes. Advantageously, this original state is obtained upon completion of the ultimate phases of the manufacturing process, which mainly consist in interconnecting the elementary components, typically the memory cells, together, and to the outside of the device which contain same, using metal pads and connections, generally defined by photolithography. Such ultimate phases are generally called BEOL, the acronym for "Back-End of Line", i.e. steps executed at the "end of the production line". Generally, during such BEOL steps, the memory cells must resist temperatures which may reach 400° C., typically, for a few minutes, and even a few dozens of minutes. Advantageously, the step of programming the matrix in order to electrically bring a set of selected cells from the original high resistive state to a less resistive state (LRS) is executed after BEOL. Advantageously too, during the step of mounting, a thermal stress smaller than the one applied during the BEOL steps, typically temperatures lower than those applied during the BEOL, is/are applied to the memory cells.

The dielectric layer is typically made of hafnium oxide (HfO2), titanium oxide (TiO2) or zirconium oxide (ZrO2). The layer 30 may be added whatever the structure of the memory cell considered. For the exemplary structures of the prior art shown in FIGS. 1a to 1d, the dielectric layer is added, for instance, as respectively shown in FIGS. 2a to 2d. As already mentioned above, the dielectric layer 30 is not necessarily in contact with the phase-change material 20 and may for instance divide, for instance in two, the third conducting element 40, as shown in FIG. 2e.

Figure 2A:
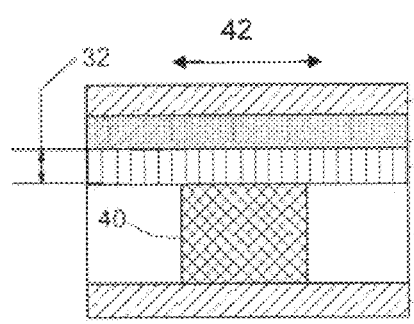
FIGS. 2a to 2f illustrate structures of memory cell of the PCM type according to the invention comprising a thin additional dielectric layer.

More precisely, in the exemplary structure of memory cell illustrated in FIG. 2a, the layer of dielectric material 30 is positioned between the layer of phase-change material 20 and a conducting element 40. Preferably, the various elements successively laid on an electrode 60 are: a conducting element 40, the layer of dielectric material 20, the layer of phase-change material 30, and another electrode 10. According to a particular embodiment, such layers are in contact two by two, i.e. no intermediate layer is present. In this example, the conducting element 40 has the shape of a solid cylinder or a tube. Preferably, the conducting element 40 is coated with dielectric material 50.

The main advantage of this embodiment is that it is particularly simple to obtain. Besides, it makes it possible to reduce the contact surface between the conducting element 40 and the layer of the dielectric material 30. As a matter of fact, this contact surface is smaller than the surface of the face of the layer of dielectric material 30 which is in contact with the conducting element 40. The active area, i.e. the area which is submitted to the application of a current and a voltage is then restricted.

Figure 2B:
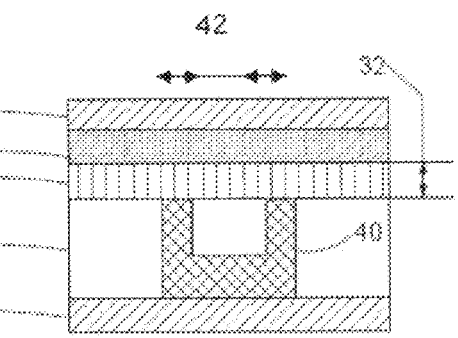

The exemplary structure of memory cell illustrated in FIG. 2b is different from that in FIG. 2a in that the conducting element 40 has the shape of a ring or of a tube. This embodiment has the advantage or reducing even more the contact surface between the conducting element 40 and the layer of the dielectric material 30. This surface is a ring and not a disk, like the structure in FIG. 2a. Preferably the phase-change material 40 is buried in a layer of dielectric 50. Besides, this embodiment has the advantage of enabling the creation of a contact area 42 having a sub-lithographic size. As a matter of fact, the size of the contact area 42 between the conducting element 40 and the layer of dielectric material 30 directly depends on the thickness of the conducting element 40. Now, the latter is checked during the step of compliant deposition of the phase-change material 40 and thus does not require using steps of lithography and etching to check the size of the contact area 42. Thus, by omitting such steps of lithography and etching, it is possible to obtain a contact area having a sub-lithographic size. Thus, by omitting such steps of lithography and etching, this embodiment has the advantage of reducing the complexity of the process of production of the memory cell.

Figure 2C:
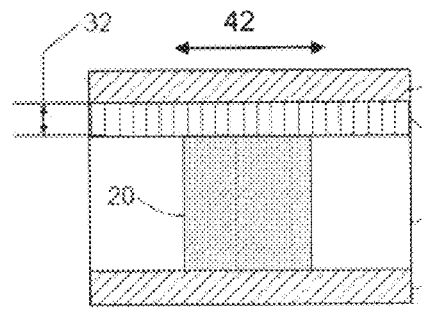

In the exemplary structure of memory cell illustrated in FIG. 2c, the layer of dielectric material 30 is positioned between the layer of phase-change material 20 and an electrode 10. Preferably, the various elements successively laid on an electrode 60 are: the layer of phase-change material 20, the layer of dielectric material 30 and another electrode 10. According to a particular embodiment, such layers are in contact two by two, i.e. no intermediate layer is present. In this example, the cell has no other conducting element 40 than the electrodes 10, 60. In this example, the layer of phase-change material 20 has the shape of a solid cylinder or of a column. Preferably, it is coated with dielectric material 50. The main advantage of this embodiment is that it is particularly simple to obtain. As a matter of fact, it does not require to manufacture a conducting element 40, which thus reduces the complexity of the manufacturing process for the memory cell. In addition, this embodiment has the advantage of making the memory cell asymmetric. As a matter of fact, the presence of the layer of dielectric material 30 makes the structure of the memory cell very unbalanced, thus enabling a better control of the subsequent operation thereof. Besides, the interest of this embodiment is that it confines the region which the current flows through. The active volume of the phase-change material is thus reduced. This active region depends on the contact surface between the phase-change material 20 and the electrode. The column-shape of the layer of phase-change material 20 thus makes it possible to reduce the contact surface, thus reducing the current required for operating the memory cell.

Such structure is preferably obtained by making a cavity or a through-hole in the dielectric layer 50 and then in depositing the phase-change material 20 inside the hole.

Figure 2D:
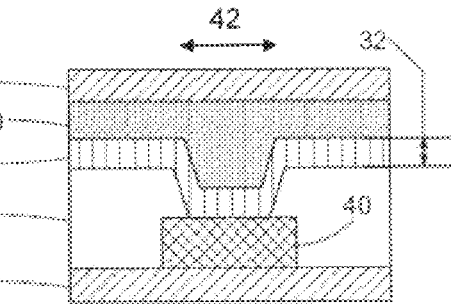
Figure 2E:
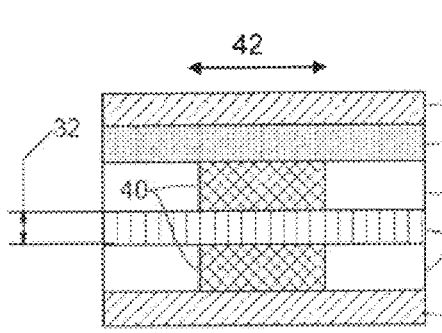

In the exemplary structure of memory cell illustrated in FIG. 2d, the dielectric layer 30 is positioned between the layer of phase-change material 20 and a conducting element 40, like FIG. 2a. Reversely, the layer of the phase-change material 20 follows the relief of the dielectric material 50 coating the conducting element 40. The layer of dielectric material 30 also follows the shape of the relief. In this embodiment again, the contact area between the conducting element 40 and the dielectric layer 30 is reduced, it may for instance be smaller than the surface of a pad formed by the conducting element 40.

The exemplary structures of memory cell illustrated in FIGS. 2a, 2b, 2c and 2d has the advantage of reducing the current required for the subsequent operation of the memory cell when the latter is written using the conventional mode of operation of the phase-change memories. As a matter of fact, during the step of breakdown of the layer of dielectric material 30, a conducting path is created through the layer of dielectric material 30. The contact area between this conducting path and the layer of phase-change material 20 is smaller than or equal to the contact area between the conducting element 40 and the layer of dielectric material 30. Now the current required to operate the phase-change memory cells is directly linked to the contact area of the smallest conducting area in contact with the layer of phase-change material 20. Thus, by creating a conducting path through the layer of dielectric material 30, the contact area of which is smaller than the contact area of the conducting element 40, the current required for subsequently operating the written memory cell using the conventional operation mode of the phase-change memories is reduced.

The structure of the memory cell illustrated in FIG. 2e shows two conducting elements 40, 40 positioned on either side of the layer of dielectric material 30. Preferably, the various elements successively laid on an electrode 60 are: a first conducting element 40, the layer of dielectric material 30, a second conducting element 40, the layer of phase-change material 20, and another electrode 10. According to a particular embodiment, such layers are in contact two by two, i.e. no intermediate layer is present. In this example, the conducting elements 40 each have the shape of a solid cylinder or a tube. Preferably, they are buried in a dielectric material 50. This embodiment has the advantage of separating the dielectric layer 30 and the layer of phase-change material 20, which enables to use non compatible materials for both layers.

Figure 2F:
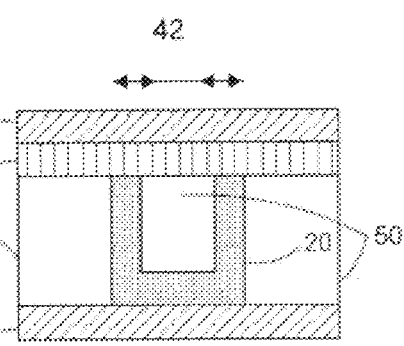

In the exemplary structure of memory cell illustrated in FIG. 2f, the various elements successively laid on an electrode 60 are: the layer of phase-change material 20, a section of which is tubular, the layer of dielectric material 30 and another electrode 10. According to a particular embodiment, such layers are in contact two by two, i.e. no intermediate layer is present. In this example, the cell has no other conducting element 40 than the electrodes 10, 60. The layer of phase-change material 20 has the shape of a tube, one end of which is closed. Preferably, it is coated with dielectric material 50.

The exemplary structure of memory cell illustrated in FIG. 2f is thus different from that in FIG. 2e in that the phase-change material 20 has the shape of a ring or of a tube. This embodiment has the advantage of reducing even more the volume of the active region of the phase-change material 20. This volume is a tube and not a cylinder, like the structure in FIG. 2e. Preferably the phase-change material 20 in the shape of a tube is buried in a layer of dielectric 50. Besides, this embodiment has the advantage of enabling the creation of a contact area 42 having a sub-lithographic size. As a matter of fact, the size of the contact area 42 between the phase-change material 20 and the layer of dielectric material 30 directly depends on the thickness of the phase-change material 20. Now, the latter is checked during the step of compliant deposition of the phase-change material 20 and thus does not require using steps of lithography and etching to check the size of the contact area 42. Thus, by omitting such steps of lithography and etching, it is possible to obtain a contact area having a sub-lithographic size. Thus, by omitting such steps of lithography and etching, this embodiment has the advantage of reducing the complexity of the process of production of the memory cell.

The latter advantageously comprises at least the following steps:
Drilling a hole in the dielectric layer 50;
Compliant deposition of a layer of phase-change material 20 onto the dielectric layer; A layer of phase-change materials is thus formed and covers the walls and the bottom of the hole;
Filling the hole with dielectric material; such filling thus covers the phase-change material positioned on the walls and the bottom of the hole;
Removal of the phase-change material outside the cavity, preferably by chemical-mechanical polishing (CMP).

In an alternative solution, the phase-change material may be deposited in a blind cavity in the dielectric layer, and then the phase-change material may be made accessible for being in contact with the electrode 60.

Preferably, in each one of these embodiments, the conducting element 40 has an external diameter smaller than those of the layer of phase-change material 20 and the dielectric layer 30.

The dielectric layer 30 is typically deposited, in the case of the hafnium oxide (HfO2), at a temperature of 350° C. using a so-called ALD method, the acronym for «atomic layer deposition», a method wherein the surface whereon the deposition is made, is successively exposed to various chemical precursors in order to obtain very thin (atomic) layers. The operation is repeated as many times as necessary to obtain the desired thickness 32, from 2 to 8 nanometres (nm) in the example used to illustrate the invention. Other methods for producing the dielectric layer 30 can be used and may comprise all the ones currently implemented by the micro-electronics industry for depositing layers of various materials: spraying, co-spraying, CVD, i.e. chemical vapour deposition and oxidation so long as they confer to the dielectric layer 30 the electrical and physical properties suitable for the application considered.

Figure 3A:
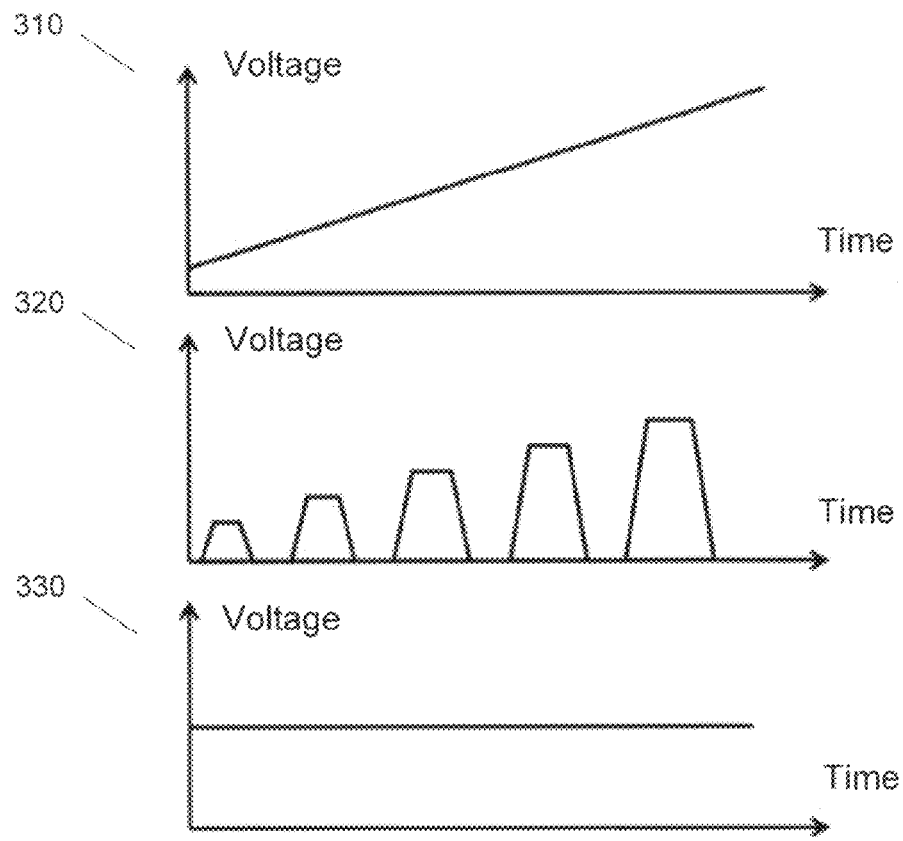
FIGS. 3a to 3b illustrate methods of breakdown of the dielectric layer.
Figure 3B:
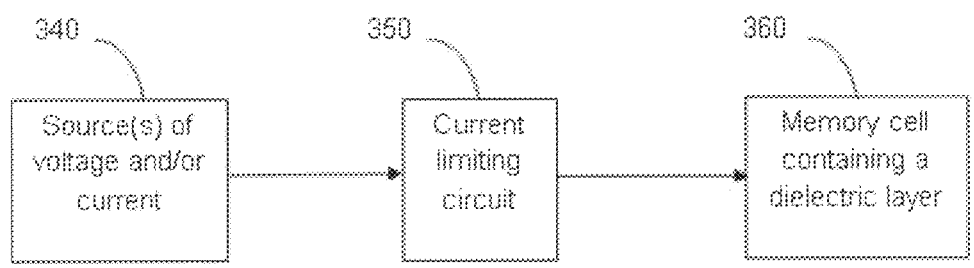

The invention provides that, upon completion of an electrical procedure disclosed in FIGS. 3a and 3b, and applied to some of the cells of a matrix of memory cells, the dielectric layer 30 is made conducting in same cells. This procedure makes it possible to customize the matrix of memory cells by placing some of these in a fourth resistive state and leaving the other ones in the high resistive state, i.e. the original HRS state.

The fourth resistive state obtained by modifying the dielectric layer by applying a voltage to the memory cell is called the «low» state or second resistive state, with the first resistive state being the original resistive state. It is also designated by the acronym breakdown LRS (for low resistive state obtained by breakdown).

The information binary-coded by the cell in the breakdown LRS state, a "low" resistive state shall be "1" if the information coded by the cell in a "high" resistive state, (original HRS) is "0". On the contrary, the information binary-coded by the cell in the breakdown "low" state shall be "0" if the information coded by the cell in the "high" state is "1".

Figure 5:
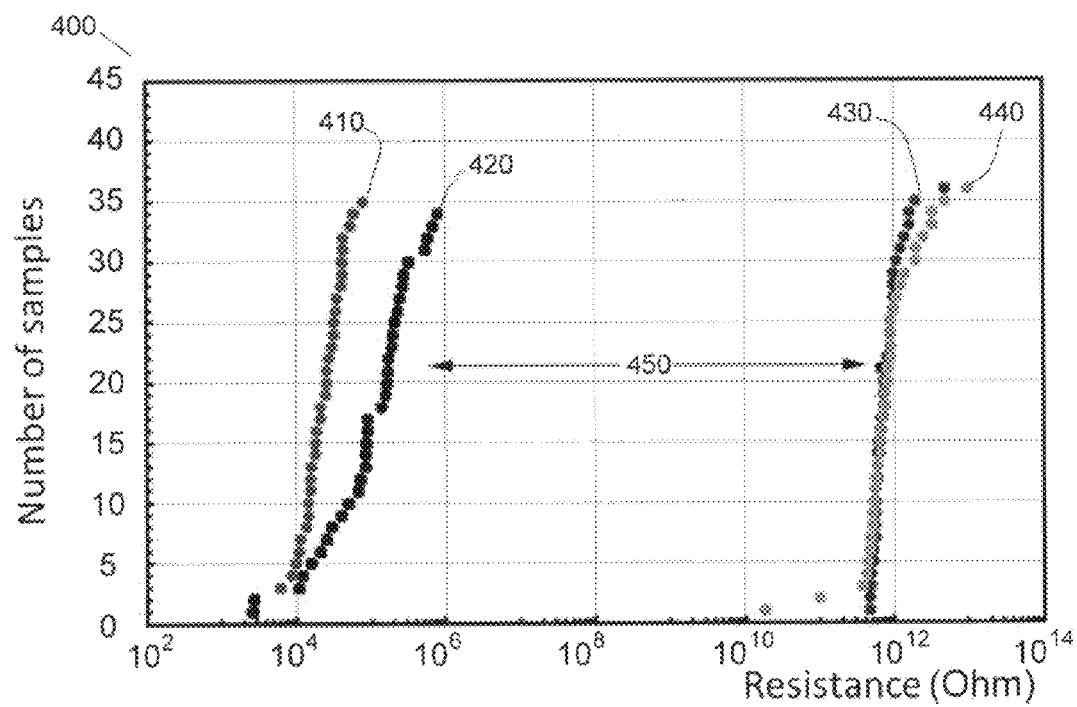
FIG. 5 compares the low resistive states obtained after the application of the breakdown procedure with the high resistive states initially obtained at the end of the production cycle and their evolution after application of a thermal stress.

The low and high resistive states of a memory cell according to the invention are more particularly characterized in FIG. 5.

FIGS. 3a and 3b illustrate examples of electric procedures for positioning a memory cell in a «low» state.

A solution 310 consists in applying to the dielectric layer 30 an increasing potential difference in the form of a voltage ramp from a null or minimum value to a maximum value (Vmax) depending, as above, on the dielectric material used, the thickness 32 thereof and on the area of the conducting element in contact with the dielectric material. The maximum voltage applied aims at obtaining a «breakdown», of the dielectric layer.

In an alternative solution, the electrical procedure for placing a cell in a "low" state consists in applying to the dielectric layer 30 an increasing potential difference in the form of a succession of voltage pulses 320 from a null or minimum value to a maximum value (Vmax) depending, as above, on the dielectric material used, the thickness 32 thereof and on the area of the conducting element in contact with the dielectric material.

A continuous voltage sufficient to cause the breakdown of the dielectric layer may also be directly applied, for a given time, as shown in diagram 330.

In all cases, as illustrated in FIG. 3b, circuits inside or outside the device, and intended to provide this function must be able to deliver a sufficient voltage and/or current, from a suitable source 340. Besides, in order not to damage the memory cells 360 containing a dielectric layer which must be broken down, the pre-programming circuits will advantageously comprise a current limiting circuit 350.

A memory cell matrix according to the invention can thus be customized prior to the steps of reflow soldering described in the state of the art section, without the "low" and "high" states thereof being significantly affected by the thermal stress of mounting, typically by brazing or reflow soldering (260° C.) as can be seen in FIG. 5.

Prior to the step of mounting and upon completion of same step, the distribution of the resistances of the memory cells in the «low» states does not overlap the distribution of the resistances in the «high» states.

Consequently, upon completion of the steps of brazing or welding, the data contained in a customized memory cell matrix can thus be retrieved. Advantageously, such data is stored in a temporary memory of a computer system directly controlling the memory cells matrix or the embedded system containing same.

The breakdown procedure for the dielectric layer is then applied to all or part of the cells in the matrix.

Upon completion of this step, the memory cell matrix is no longer customized, all or part of the cells are in the "low" state. They can thus be used as standard PCM memory cells since the dielectric layer has been broken down in all the cells. More particularly, the data specific to the customization and stored in the above temporary memory can be rewritten into the memory cells of the matrix using the conventional writing mode of such phase-change memories, wherein the material electrically changes from an amorphous phase to at least one crystalline phase and reversely.

The experiments shown in the following Figures reveal that the phase-change memory cells were not affected by the presence of the dielectric layer and returned to their conventional operation after breakdown of the latter.

Figure 4:
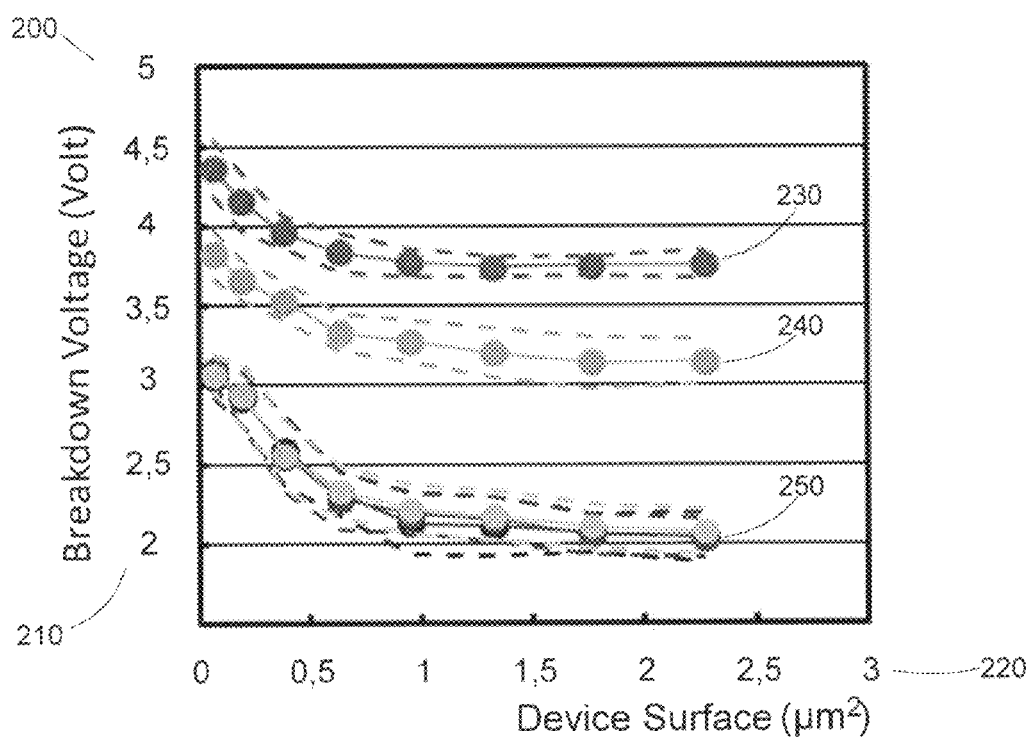
FIG. 4 shows the voltages which have to be applied to obtain the electric breakdown of the dielectric layer in a memory cell.

FIG. 4 shows the variation in the breakdown voltage for a device as shown in FIG. 2a where the dielectric layer is made of hafnium oxide (HfO2).

The diagram 200 shows the dependence of the breakdown voltage 210 with respect to the surface 220 of the contact area between the dielectric layer 30 and the conducting element 40 for various thicknesses of HfO2 ranging from 3 to 8 nm. The diameters 42 referred to in the non limiting examples of structure in FIGS. 2a to 2e give the diameters of the contact areas between the dielectric layer 30 and the element (electrode 10 or conducting element 40) in contact with the dielectric layer 30. It can be seen then that, when the contact area is small, and more particularly when it is less than 0.5 $\mu m^2$ (µm or micrometre, i.e. $10^{-6}$ metre), the breakdown voltage of the same layer thickness significantly increases. The highest breakdown voltages 230 are of course obtained with the thickest oxide layer, i.e. 8 nm in this example. They significantly decrease when the thickness is reduced to 5 nm 240 and to 3 nm 250. The dotted lines show the dispersion of the measures about the average.

It should be note here that, to remain in a range of currently available voltages, to supply the devices of the micro-electronic type, i.e. 5 volts, a compromise must be found between the dielectric material used, the thickness thereof and the surface in contact with the lower electrode. As shown in diagram 200, the thickness of the dielectric layer, for contact surfaces of less than 0.5 $\mu m^2$, thus cannot be substantially greater than 8 nm.

FIG. 5 compares the low resistive states («low» or breakdown LRS states) obtained after applying the breakdown procedure to the high resistive states («high» or original HRS states) initially obtained at the end of the production cycle. The diagram 400 also shows the evolution of such resistive states after application of a thermal stress (260° C.) which can be compared to the one which the programmed devices have been exposed to during the steps of reflow soldering.

To explain this in greater details, the state of a cell prior to and after mounting can thus be differently qualified.

The resistive state, after mounting of a memory cell which was, prior to mounting in the original resistive state 430 is called the third resistive state 440. Such state is a high resistive state. It is also called "mounting HRS" for High Resistive State", after mounting.

Besides, the resistive state, after mounting of a memory cell which was, prior to mounting in the second resistive state 410 (breakdown LRS) is called the fourth resistive state 420. Such fourth resistive state 420 is a low resistive state. It is also called "mounting LRS" for Low Resistive State", after mounting.

It should be noted that the distributions of the high resistive states prior to 430 (original HRS) and after 440 (mounting HRS) applying the thermal stress are almost similar. The resistances of the cells in the original resistive state (original HRS) and in the third resistive cell (mounting HRS) are thus identical or almost identical. The low resistive states are more sensitive to such stress. A shifting to higher resistance values can be noted after the application of the thermal stress, of the distribution of the low resistive states 420 with respect to what it was beforehand 410. Thus the resistance 410 of the cells in the second resistive state (breakdown LRS) are not as high as in the fourth resistive state (mounting LRS) 420. It should however be noted that a very big difference in the resistance 450 remains between the third resistive states (mounting HRS) and the low resistive states (mounting LRS). In this example, this difference between the resistance distributions amounts to approximately 6 orders of magnitude ($\times 10^6$). This is more than enough to design a reading circuit which can unambiguously discriminate the "low" states and the "high" states and retrieve the pre-programmed content of the matrix of memory cells after the reflow soldering operations. In practice, an order of magnitude ($\times 10$) makes it possible to use a simple reading circuit. A factor two between the maximum resistance of the distribution of the LRS state and the minimum resistance of the distribution of the HRS state may reveal sufficient, but a factor 5 or 10 is preferred to enable the use of a reading circuit which remains simple enough and not expensive to implement.

The above results have been obtained with a device corresponding to the structure of FIG. 2a having a circular contact surface with a diameter of 300 nm and with a dielectric layer having a thickness of 3 nm.

Figure 6:
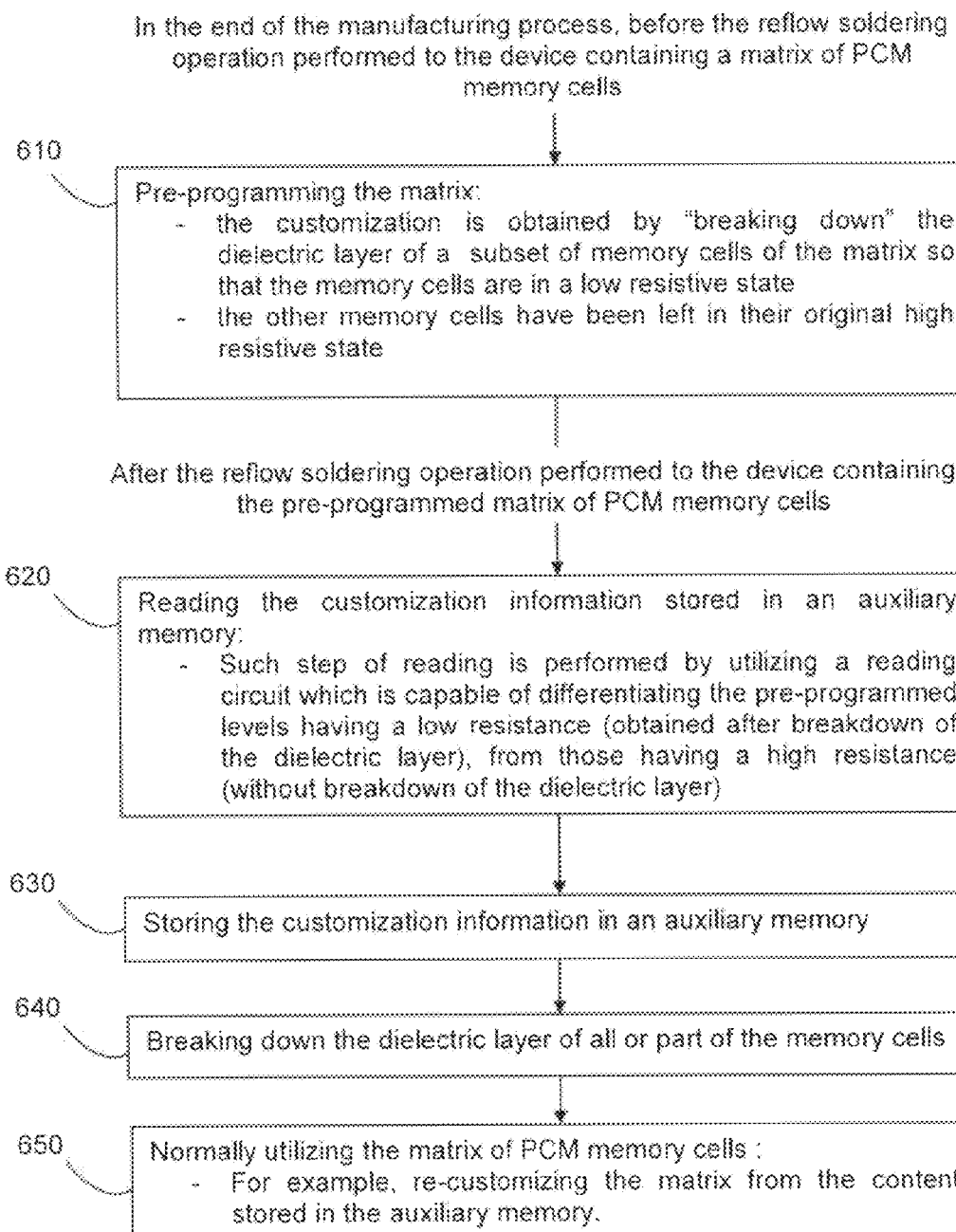
FIG. 6 illustrates the steps of the method for pre-programming a matrix of memory cell according to the invention.

FIG. 6 summarizes the steps of an example of a method for pre-programming a matrix of memory cells of the PCM type according to the invention. The method makes it possible to retrieve, after the thermal stress of the step of mounting, typically by brazing or reflow soldering, the information programmed prior to such step.

Step 610 describes the customization of a matrix of PCM memory cells according to the invention, i.e. memory cells comprising a dielectric layer 30 as illustrated in FIG. 2. Programming such a matrix consists in making less resistant a subset of cells in the matrix by causing the breakdown, in each cell of the subset, of the thin dielectric layer by applying a dedicated electrical procedure as disclosed above in FIGS. 3a and 3b. Each cell is thus able to store a bit of information as two levels of electrical resistance: one having a weaker resistance ("low" or breakdown LRS state) obtained after the breakdown of the dielectric layer; the other one having a higher resistance ("high" or original HRS state) corresponding to the initial state of the cell at the end of the production cycle. Only the low resistive states are programmed during step 610.

The following step 630 is executed after the device containing the pre-programmed matrix has been exposed to the thermal stress of the mounting. Such thermal stress comprises for example a step during which the memory cells are exposed to a temperature of at least 240° C. or even at least 260° C. for several seconds, and often at least 10 seconds.

After this steps which generally consists in welding or brazing the matrix or a component comprising the matrix onto a support such as a printed card, the contents of the pre-programmed matrix is read. The reading circuit used for this purpose is so designed as to differentiate the low resistance states (mounting LRS), obtained after breakdown of the dielectric layer, from those having a high resistance (mounting HRS) corresponding to the memory cells which have been left in their initial state. The reading circuit takes into account the drift of the resistance values which can be noted after the application of the thermal stress. Such drift more particularly affects the low resistive states, as seen in FIG. 5. The cells which had initially been programmed by the breakdown and those which had not been programmed can then be identified.

Preferably, the method comprises additional and optional steps. The step of reading 620 of the content of the pre-programmed matrix goes with the storage 630 of the information read in an auxiliary memory. Typically, the information read is temporarily stored by the device control means which comprises the pre-programmed memory matrix after mounting thereof, for instance, in an embedded system.

During the next step 640, all or part of the cells of the pre-programmed cells are broken down so that the memory cells can then be used as standard PCM memory cells. Optionally, such step may be thoroughly executed on all the cells in the matrix or, as the content of the pre-programming is available at this stage, it may execute such operation on the subset of cells which were not already broken down during the pre-programming or on a subset of cells which were not already broken down during the pre-programming only. Upon completion of this operation, whatever the option used, the cells the dielectric layer of which is broken down, may be used as standard PCM cells.

These cells of the PCM memory matrix can then be normally used 650, and in particular the pre-programmed binary values can be restored from the auxiliary memory, by controlling, this time electrically, the phase and thus the resistance of the layer of phase-change material 20 of the PCM memory cell.

Among the advantages provided by the invention, it should more particularly be noted that a dielectric layer may be added whatever the phase-change material and the structure of the cell selected to meet the specifications of a particular application of a memory cell matrix. This layer may always be added, since it enables the PCM cells to hold the pre-programmed information in spite of the thermal stress of the steps of reflow soldering.

The additional layer is simply integrated in the structure of a conventional PCM memory cell by depositing dielectric material, for instance, by an ALD type deposition, or by using one of the standard method implemented by the micro-electronics industry.

The pre-programming method is compatible with a procedure carried out at the end of the production line, at the wafer level, i.e. prior to cutting electronic chips wherein the memory matrix is integrated.

To make sure a memory cell can be used within the scope of the present invention, the following points must be checked:

the dielectric used (i.e. material, thickness, contact area) must preferably have been made conducting by applying a voltage ramp or a succession of voltage pulses at ambient temperature or by applying a sufficient continuous voltage.

the maximum voltage applied during the voltage ramp or the succession of voltage pulses or the value of the continuous voltage must preferably be lower than the maximum voltage which can be provided by the aimed application (5V for the mobile applications).

the ratio between the resistances in the "high" and "low" states must preferably be significant enough to be easily detected by the reading system of the aimed application (typically a ratio above an order of magnitude is desired).

after the welding step, the distributions of the resistances of the "high" and "low" states must preferably not overlap.

the dielectric material must not affect the subsequent PCRAM operation of the cell. For instance, no inter-diffusion must occur between the dielectric layer and the phase-change material used, for instance the GST, which might result in a material no longer having phase-change properties or the properties of which would be degraded with respect to those of an initially selected phase-change material, more particularly as regards the performances such as the retention of information, the programming currents, the endurance.

the dielectric material selected must preferably be compatible with the manufacturing process. For example, the dielectric material must not be incompatible with the micro-electronics equipment, as regards contamination.

To check the above points, an approach consists in testing the feasibility of the considered solution:

by integrating the selected dielectric material in the GST within a MIM (metal-insulator-metal) capacitor to test the possibility of making the dielectric material conducting and to characterize the specific electrical procedure.

by integrating the selected dielectric material in the chosen phase-change material within an actual memory cell to test the subsequent operation of the PCRAM cell.

The above description more particularly discloses embodiments wherein the step of mounting is executed by welding or brazing. The invention also extends to embodiments wherein the mounting of the component containing the matrix of memory cells on a support is executed using the so-called WLCSP (Wafer Level Chip Scale Packages) technique.

Such mounting technique has been developed by the micro-electronics industry to enable the mounting of the components belonging to an embedded system one or more printed circuits. This technique relies on the deposition, onto the component to be mounted, of a layer of photodefinable polymeric material, for instance a polyimide material, i.e. a polymeric material containing one or more imide groups in its main chain, or polybenzobisoxazole, also called PBO. As these materials are photodefinable, the layer thus deposited can be etched by being exposed to a suitable light stimulus followed by a a development. A metal ball may then be placed in the cavity which has just been obtained. This ball is responsible for the mechanical and electrical contacts between the component to be mounted and the corresponding printed circuit(s).

In some cases, the deposit of a metal layer, for example of copper, called a ReDistribution Layer or RDL, which is etched, is substituted for the metal ball deposit. Such RDL layer is then encapsulated using a photodefinable polymeric material which is, in turn, etched by being exposed to a suitable light stimulus and development. This ball which is responsible for the mechanical and electrical contacts between the component to be mounted and the corresponding printed circuit(s) is then placed in the cavity which has just been obtained.

In some cases, the deposition of the metal ball is preceded by obtaining a so-called UBM (for Under Bump metallurgy) metal layer, made of Copper or Nickel-based (refer to the Figures hereunder).

The layer(s) of the polymeric material must often be obtained using a method including steps of high temperature annealing. An example of the main steps required for obtaining a layer of polymeric material which may be used in the mounting techniques described above is provided in the following:

Preparation of the substrate: T° 80° C.—200° C.—Duration: 60-240 seconds (s)
Soft bake: T° 120° C.—Duration: 180s
Nitrogen curing (HD2280):
    Temperature increase: 25° C.→150° C. with a gradient of 4° C./min
    Temperature increase: 150° C.-320° C. with a gradient of 2.5° C./min
    Temperature hold: 320° C. for 1 hour
    Progressive cooling to ambient temperature
The above-mentioned indications relate to another example of nitrogen curing (HD-4100):
    Temperature increase: 25° C.→200° C. with a gradient of 10° C./min
    Stand-by at 200° C. for 30 min
    Temperature increase: 200° C.→375° C. with a gradient of 10° C./min
    Temperature hold: 375° C. for 1 hour
    Progressive cooling to ambient temperature These methods thus comprise at least of step at a temperature above 240° C., often above 300° C. and most often between 320° C. and 375° C. for several dozens of minutes, typically 60 minutes.

The invention makes it possible to retrieve, after the step at a very high temperature, the data saved prior to mounting.

The invention is not limited to the embodiments described above but applies to all the embodiment covered by the scope of the claims.

The invention claimed is:

1. A method for pre-programming a matrix of phase-change memory cells, including a phase-change material positioned between two conducting electrodes, said phase-change material being able to be reversely electrically modified so as to vary the resistivity of the memory cell, wherein at least a dielectric layer is provided, which is positioned between the two conducting electrodes, with the memory cell having an original resistive state (original HRS) at the end of the memory cell production process, the method comprising:

executing a step of pre-programming the matrix is executed prior to a step of mounting a component containing said matrix onto a support, with the step of pre-programming including applying a breakdown voltage to a selected portion of all the memory cells based on coded data to be stored in the matrix so that, for each one of the selected cells, the layer of the dielectric material breaks down to bring the cell from the original resistive state (original HRS) to a second resistive state (breakdown LRS), so that the cells which were, prior to mounting, in said original resistive state (original HRS) and in said second resistive state (breakdown LRS) are, after the step of mounting, in a third resistive state (mounting HRS) and in a fourth resistive state (mounting LRS), respectively, and in that the resistance of the cells in said third resistive state (mounting HRS) is at least twice higher than the resistance of the cells in said fourth resistive state (mounting LRS);

and after mounting, reading the resistive state of all the cells in the matrix so as to identify the cells which are, after mounting, in said third resistive state (mounting HRS) and those which are in said fourth resistive state (mounting LRS).

2. A method according to claim 1, wherein at least the following steps are executed after mounting a component containing said matrix onto a support:

storing the resistive states (mounting HRS, mounting LRS) read in an auxiliary memory so as to save the pre-programming of the matrix,
applying a breakdown voltage to at least a plurality of memory cells so that all the layers of dielectric material of all or part of the memory cells in the matrix break down,
rewriting, into the matrix, the pre-programming saved in the auxiliary memory by modifying the phase-change material of selected memory cells.

3. A method according to claim 1, wherein the step of mounting comprises a step of brazing or welding the component onto the support.

4. A method according to claim 1, wherein the step of mounting comprises a step during which the memory cells are exposed to a temperature of at least 240° C. for at least 10 seconds.

5. A method according to claim 1, wherein the step of mounting the component containing said matrix on the support comprises mounting the component onto a printed card, an electronic card, or with another electronic component or on a box.

6. A method according to claim 1, wherein the resistance of the cells in said third resistive state (mounting HRS) is at least five times higher than the resistance of the cells in said fourth resistive state (mounting LRS).

7. A method according to claim 1, wherein, during the step of applying a breakdown voltage to at least a plurality of memory cells so that all the layers of dielectric material of all the memory cells in the matrix break down, the breakdown voltage is applied to the cells in said third resistive state (mounting HRS) only, upon completion of the step of mounting.

8. A method according to claim 1, wherein applying a breakdown voltage to selected memory cells comprises, for each one of the selected cells, applying one among the following voltages:

a voltage ramp ranging from a null voltage to 10 volts and having a duration less than or equal to 500 milliseconds; a succession of voltage pulses having an increasing amplitude; a constant voltage.

9. A method according to claim 1, wherein the resistances of the memory cells in the matrix in the original resistive state (original HRS) are within a first range of values, the resistances of the memory cells in the matrix in the second resistive state (breakdown LRS) are within a second range of values, wherein the first and second ranges are separated, wherein the first and second ranges show a discrepancy of at least a factor 100 and wherein the resistances of the memory cells of the matrix in said third resistive state (mounting HRS) are within a first range of values, the resistances of the memory cells in the matrix in said fourth resistive state (mounting LRS) are within a second range of values and wherein the first and second ranges are separated.

10. A method according to claim 9, wherein reading the resistive state of all the memory cells in the matrix comprises:
  applying to each memory cell a reading voltage ranging from 50 mV to 0.7V,
  measuring the intensity of the current flowing through the memory cell in order to deduce therefrom whether the resistance of such memory cell is in said third resistive state (mounting HRS) or in said fourth resistive state (mounting LRS).

11. A method according to claim 1, wherein all the current flowing through the two conducting electrodes goes through the dielectric material.

12. A method according to claim 1, wherein the step of mounting comprises a step of mounting using the so-called wafer level chip scale packaging technique (WLCSP) during which the memory cells are exposed to a temperature of at least 300° C. for at least 30 minutes.

13. A method according to claim 1, wherein the layer of dielectric material has a resistance higher than or equal to $1^{e}7$ ohms prior to and after mounting.

14. A method according to claim 1, wherein the layer of dielectric material is so selected that it becomes conducting through the application of a voltage ramp at ambient temperature.

* * * * *